(12) United States Patent
Malantonio et al.

(10) Patent No.: US 7,393,773 B2
(45) Date of Patent: Jul. 1, 2008

(54) METHOD AND APPARATUS FOR PRODUCING CO-PLANAR BONDING PADS ON A SUBSTRATE

(75) Inventors: Edward L. Malantonio, Conshohocken, PA (US); Edward Laurent, North Wales, PA (US); Ilan Hanoon, Glenside, PA (US)

(73) Assignee: SV Probe Pte Ltd., Singapore (SG)

( * ) Notice: Subject to any disclaimer, the term of this patent is extended or adjusted under 35 U.S.C. 154(b) by 216 days.

(21) Appl. No.: 11/190,092

(22) Filed: Jul. 26, 2005

(65) Prior Publication Data

US 2006/0022690 A1 Feb. 2, 2006

Related U.S. Application Data

(60) Provisional application No. 60/591,828, filed on Jul. 28, 2004.

(51) Int. Cl.
*H01L 21/44* (2006.01)
(52) U.S. Cl. .................................. 438/613; 438/620
(58) Field of Classification Search ................ 438/613, 438/620
See application file for complete search history.

(56) References Cited

U.S. PATENT DOCUMENTS

| | | | | |
|---|---|---|---|---|
| 5,559,054 A | * | 9/1996 | Adamjee | 438/617 |
| 5,765,744 A | | 6/1998 | Tatumi et al. | |
| 6,153,938 A | * | 11/2000 | Kanda et al. | 257/778 |
| 6,323,552 B1 | * | 11/2001 | Koyama | 257/737 |
| 6,335,568 B1 | * | 1/2002 | Yuzawa et al. | 257/738 |
| 6,527,163 B1 | * | 3/2003 | Eslampour | 228/180.1 |
| 2001/0054771 A1 | * | 12/2001 | Wark et al. | 257/786 |
| 2002/0194730 A1 | | 12/2002 | Shih et al. | |
| 2003/0132027 A1 | * | 7/2003 | Maruyama et al. | 174/267 |
| 2003/0216023 A1 | * | 11/2003 | Wark et al. | 438/613 |
| 2004/0016568 A1 | * | 1/2004 | Palanisamy | 174/260 |
| 2005/0258519 A1 | * | 11/2005 | Kikuchi et al. | 257/666 |
| 2006/0000870 A1 | * | 1/2006 | Matsumura | 228/1.1 |

OTHER PUBLICATIONS

Patent Cooperation Treaty, "Notification Concerning Transmittal of International Preliminary Report on Patentability," PCT/US2005/026385, dated Feb. 8, 2007, 8 pages.
Current Claims, PCT/US2005/026385, 2 pages (attached).

* cited by examiner

*Primary Examiner*—Michael S. Lebentritt
*Assistant Examiner*—Seahvosh J Nikmanesh
(74) *Attorney, Agent, or Firm*—Hickman Palermo Truong & Becker

(57) ABSTRACT

A method and apparatus for producing a substrate having a plurality of substantially co-planar bonding pads is provided. The substrate is employed in a probe apparatus used in wafer testing of wafer-mounted semiconductor integrated circuits. The bonding pads are formed by applying a plurality of bumps of electrically conductive material to a mounting surface of the substrate using a dispensing mechanism. The bumps are subsequently deformed into a plurality of substantially co-planar bonding pads using a flattening tool. The bonding pads provide a planar surface to which probes may be mounted, improving the accuracy and precision of positioning of tips of the probes.

18 Claims, 8 Drawing Sheets

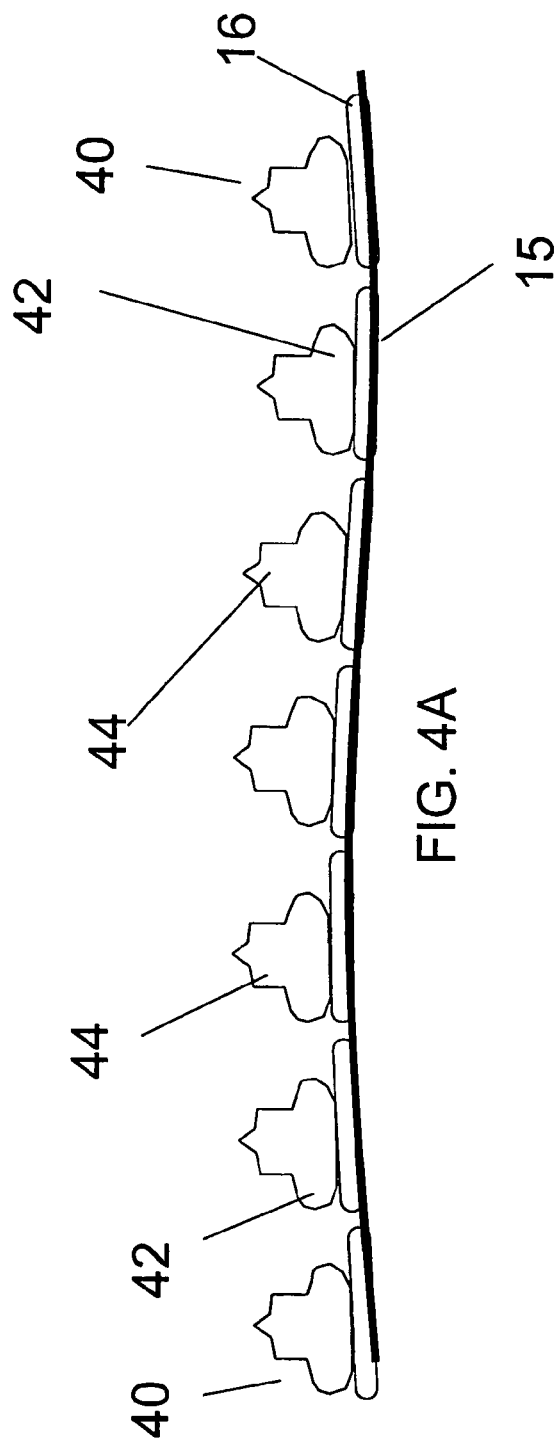
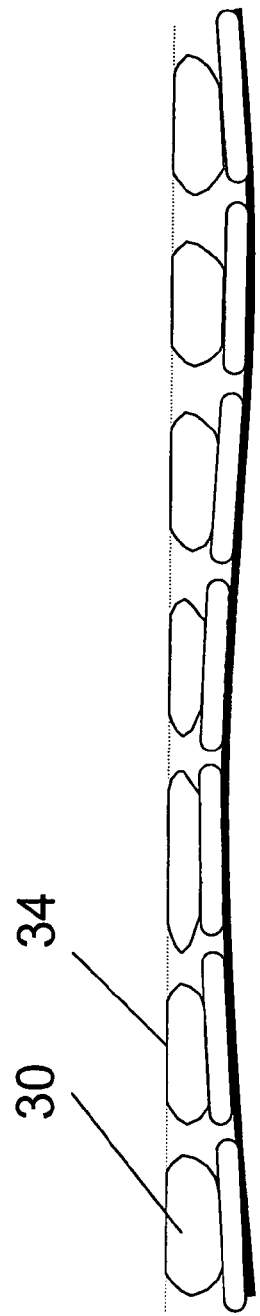

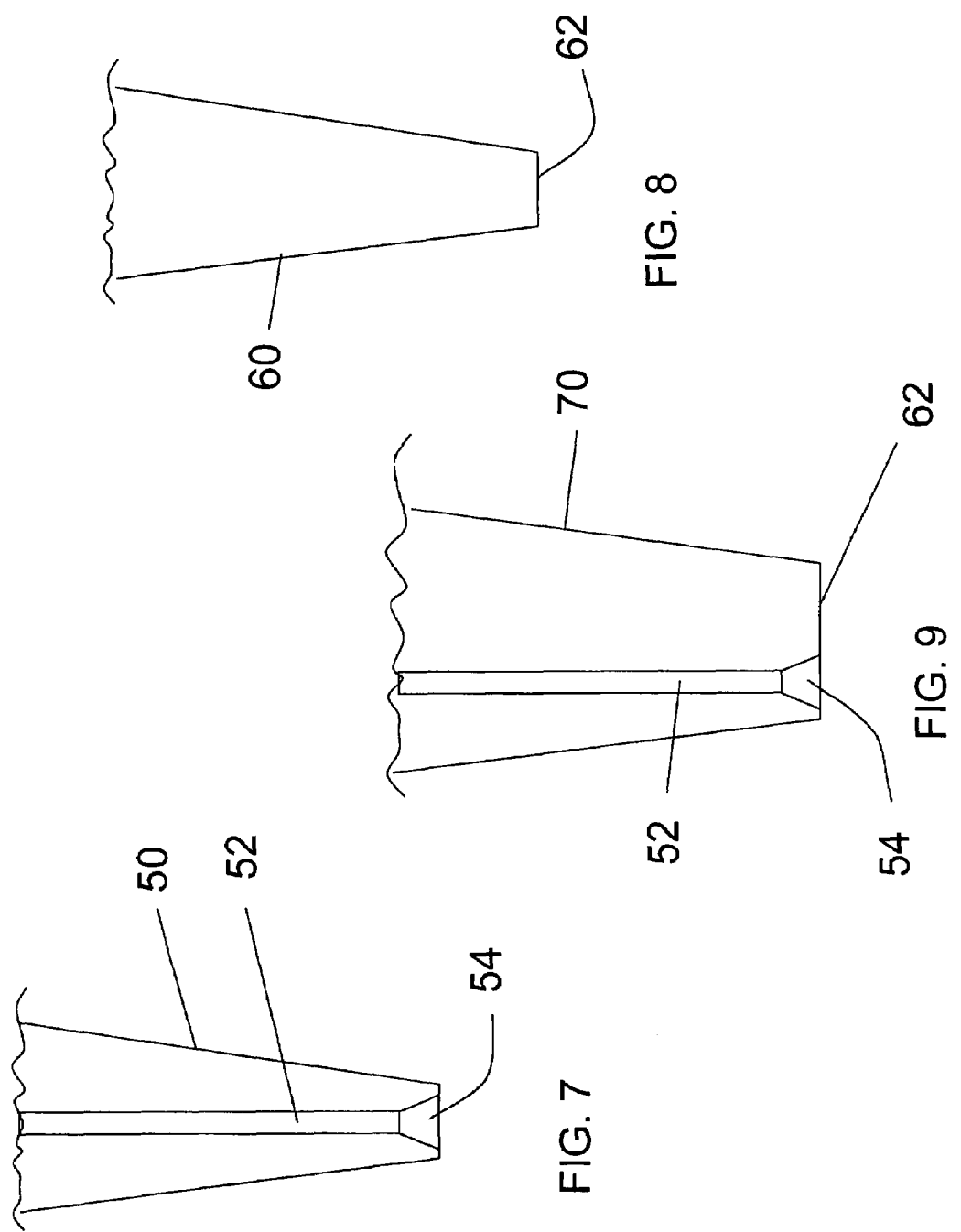

METHOD AND APPARATUS FOR PRODUCING CO-PLANAR BONDING PADS ON A SUBSTRATE

CROSS REFERENCE TO RELATED APPLICATIONS

This application claims the benefit of U.S. provisional application No. 60/591,828, filed Jul. 28, 2004.

BACKGROUND OF THE INVENTION

The present invention relates to equipment for testing of integrated circuits. More particularly, the present invention relates to a method and apparatus for producing substantially co-planar bonding pads for mounting probes to a substrate for wafer testing of semiconductor integrated circuits.

In semiconductor integrated circuit manufacturing, it is conventional to test the integrated circuits ("ICs") during manufacturing and prior to shipment to ensure proper operation. Wafer testing is a well-known testing technique commonly used in production testing of wafer-mounted semiconductor ICs, wherein a temporary electrical current is established between test equipment (e.g., automatic test equipment otherwise known as ATE) and each IC mounted on the wafer to demonstrate proper performance of the ICs. Exemplary components used in wafer testing include an ATE test board and a probe card. An exemplary ATE test board is a multilayer printed circuit board that is connected to the ATE, and that transfers the test signals back and forth between the ATE and a probe card. An exemplary probe card is a printed circuit board that generally contains several hundred probe needles positioned to establish electrical contact with a series of connection terminals on the IC wafer.

Known probe cards include probe cards available from Kulicke & Soffa, Inc. of Willow Grove, Pa. One such probe card comprises a printed circuit board, a probe head having a plurality of flexible probes, and a space transformer which electrically connects the probes to the printed circuit board. For example, the space transformer may comprise a multi-layer ceramic substrate or a multi-layer organic substrate.

It is also known to mount each of a plurality of flexible probes to a mounting surface of the space transformer. Typically, the probes are mounted to electrically conductive, preferably metallic bonding pads or circuit traces formed on (or integrated as part of) the substrate through conventional plating or etching techniques well known to those of ordinary skill in the art of semiconductor fabrication.

One difficulty in the fabrication of probe cards is that the mounting surface of the space transformer (as well as the entire substrate) is subject to waviness or non-planarity, with a result that the mounting surface for the probes is not flat. Mounting of probes to a non-planar surface leads to undesirable variation in the positions of the probe tips, which connect with the IC connection terminals. Tight positional tolerances of all the probe tips within the probe assembly are desirable for establishing and maintaining identical contacting conditions between the individual probe tips and the terminals of the tested chips. Positional tolerances affect both the position of the probe tips relative to the corresponding terminals and the force required to establish a satisfactory electrical connection between the probes and the IC connection terminals. When probe tips are of a probe card are substantially non-planar with respect to one another probing of the integrated circuits during testing may require overtravel in order to ensure contact between all of the probes and the corresponding terminals on the integrated circuit(s) to be tested. Such overtravel may reduce the life of the probes, and may also increase contact resistance between the probe tips and the corresponding terminals on the integrated circuit(s) to be tested.

During wafer testing, an array of test probe tips is brought into contact with an array of semiconductor pads/terminals in order to apply and sense voltages in an effort to ascertain the quality of the manufactured semiconductor devices. The surface of the wafer is typically maintained extraordinarily flat due to the process of optical lithography and the demands of the dimensional precision utilized to manufacture sub-micron line widths. The silicon wafers are typically polished extremely flat and during processing, planarization methods are frequently employed to maintain the flatness. Manufacturing methods utilized for ceramic or organic substrates are not typically made to the precision tolerances utilized for wafer manufacturing. The different materials employed in the substrate (e.g., metals, dielectrics), the methods applied (multilayer ceramics, plating), and their individual thickness (which are typically much larger than the metal and dielectric thin films on the surface of a semiconductor die) all contribute to the overall non-planarity.

The final steps in the preparation of the substrates normally involve plating (e.g., nickel and gold) on the surfaces of the traces (e.g., copper traces) that typically comprise the top layers of the substrate. Although electroplating can produce very smooth surface features, the underlying features of the vias and their means of manufacture may create one source of the non-planarity of the pads. The thermal expansion rates, internal stresses and the temperatures employed in the processing of the bulk of the substrates are another source of non-planarity. In order to tightly control positional tolerances of the probe tips, it is desirable that the mounting surface of the plurality of probes be as nearly flat or planar as is practicable.

BRIEF SUMMARY OF THE INVENTION

According to an exemplary embodiment of the present invention, a method for producing a plurality of substantially co-planar bonding pads on a substrate is provided. A plurality of probes of a probe card used in wafer testing of integrated circuits are mountable on the bonding pads. The method comprises the steps of applying a plurality of bumps of electrically conductive material onto a mounting surface of the substrate, and deforming a portion of the bumps into a substantially flat planar surface so as to form the bonding pads. As a result, the bonding pads are substantially co-planar. For example, the electrically conductive material may be gold, copper, platinum iridium, or other conductive materials.

According to another exemplary embodiment of the present invention, an apparatus for producing a plurality of substantially co-planar bonding pads on a substrate is provided. The apparatus comprises a fixture for holding the substrate and a bump forming mechanism for adhering multiple and separate predetermined quantities of an electrically conductive material onto a mounting surface of the substrate. The apparatus further comprises a flattening tool for flattening the predetermined quantities of material into a plurality of substantially flat planar surfaces for forming the bonding pads.

According to an exemplary embodiment of the present invention, a substrate for use with a probe card used in wafer testing of integrated circuits is provided, the substrate comprising a plurality of substantially co-planar bonding pads.

BRIEF DESCRIPTION OF THE DRAWINGS

For the purpose of illustrating the invention, there are shown in the drawings forms of the invention which are presently preferred; it being understood, however, that this invention is not limited to the precise arrangements and instrumentalities shown. In the drawings:

FIG. 4A is a schematic side view of another substrate portion of another probe card used in wafer testing of integrated circuits, illustrating a plurality of bumps applied to bonding pads on the substrate in accordance with an exemplary embodiment of the present invention.

FIG. 4B is a schematic side view of the substrate portion of the probe card of FIG. 4A, illustrating the plurality of bumps flattened into substantially co-planar bonding pads in accordance with an exemplary embodiment of the present invention.

FIG. 7 is a schematic cross-sectional view of a bumping tool component of an apparatus for producing a plurality of bonding pads on a substrate in accordance with an exemplary embodiment of the present invention.

FIG. 8 is a schematic cross-sectional view of a flattening tool component of an apparatus for flattening bumps applied to a substrate into bonding pads in accordance with an exemplary embodiment of the present invention.

FIG. 9 is a schematic cross-sectional view of a combined bumping and flattening tool component of an apparatus for producing a plurality of bonding pads on a substrate in accordance with an exemplary embodiment of the present invention.

DETAILED DESCRIPTION OF THE INVENTION

As used herein, the term "bump" is understood to mean a small amount of electrically conductive material (e.g., a mound, a ball, etc.) deposited on a substrate or other electrical component that can be used as an electrical contact for bonding, such as for bonding a probe of a probe card in an embodiment where the substrate is a portion of a probe card or probe card assembly.

As used herein, the term "bonding pad" is understood to mean a conductive region formed on or adjacent a surface of a substrate. Exemplary bonding pads are those formed through application of bumps on the substrate, and planarizing the bumps to form the bonding pads. The bonding pads may be formed in electrical contact with any conductive portion of the substrate such as include contact pads, conductive terminals, conductive vias, circuit traces, etc. Thus, bonding pads formed on a surface of the substrate is intended to include bonding pads formed on a conductive region (e.g., a trace or terminal) on the substrate.

As used herein, the terms "co-planar" and "substantially co-planar" are interchangeable. Thus, each of the bonding pads of a substrate according to the present invention need not be absolutely co-planar.

Figure 1:
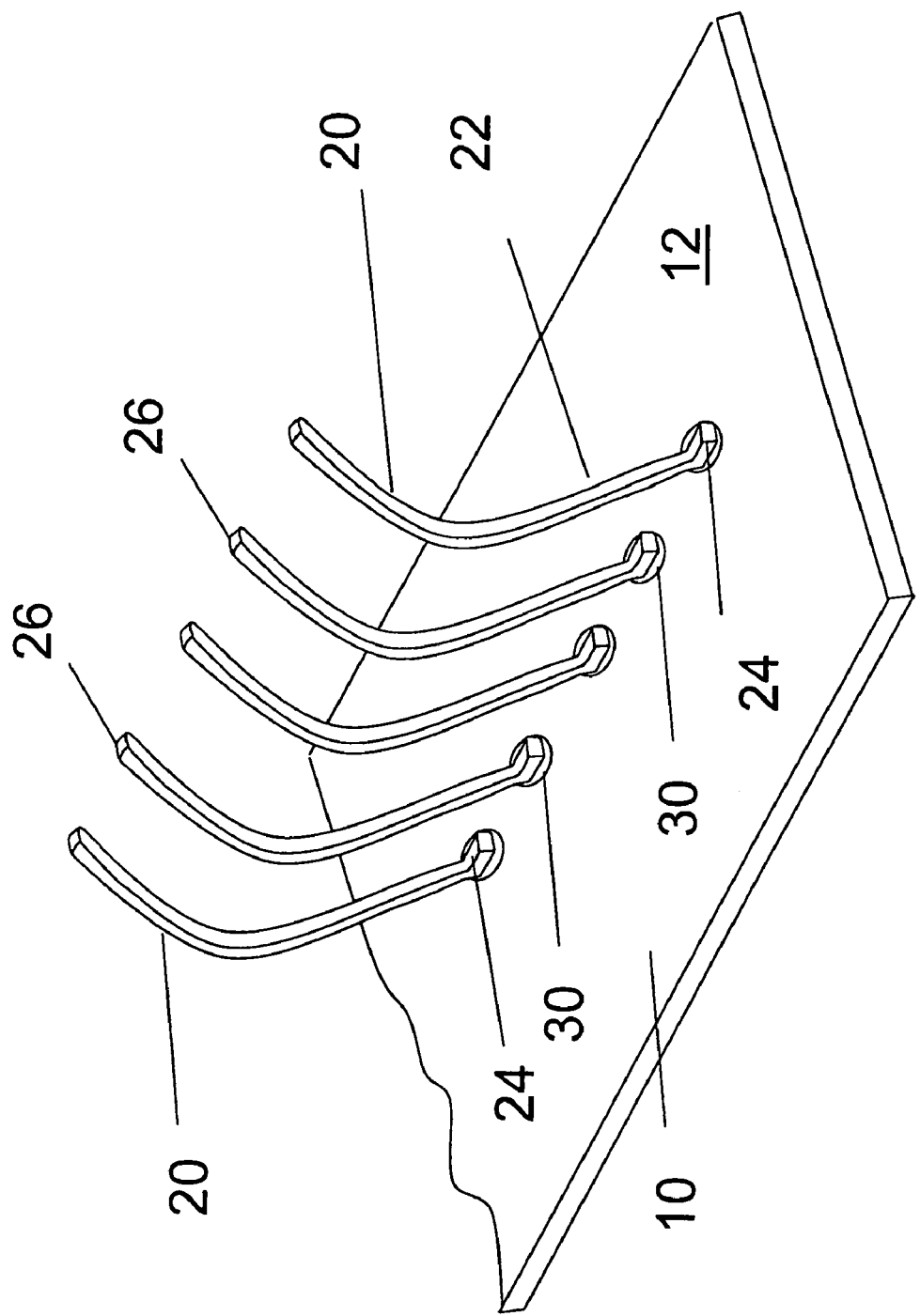
FIG. 1 is a highly enlarged perspective view of a plurality of probes mounted to a substrate portion of a probe card used in wafer testing of integrated circuits in accordance with an exemplary embodiment of the present invention.
Figure 2:
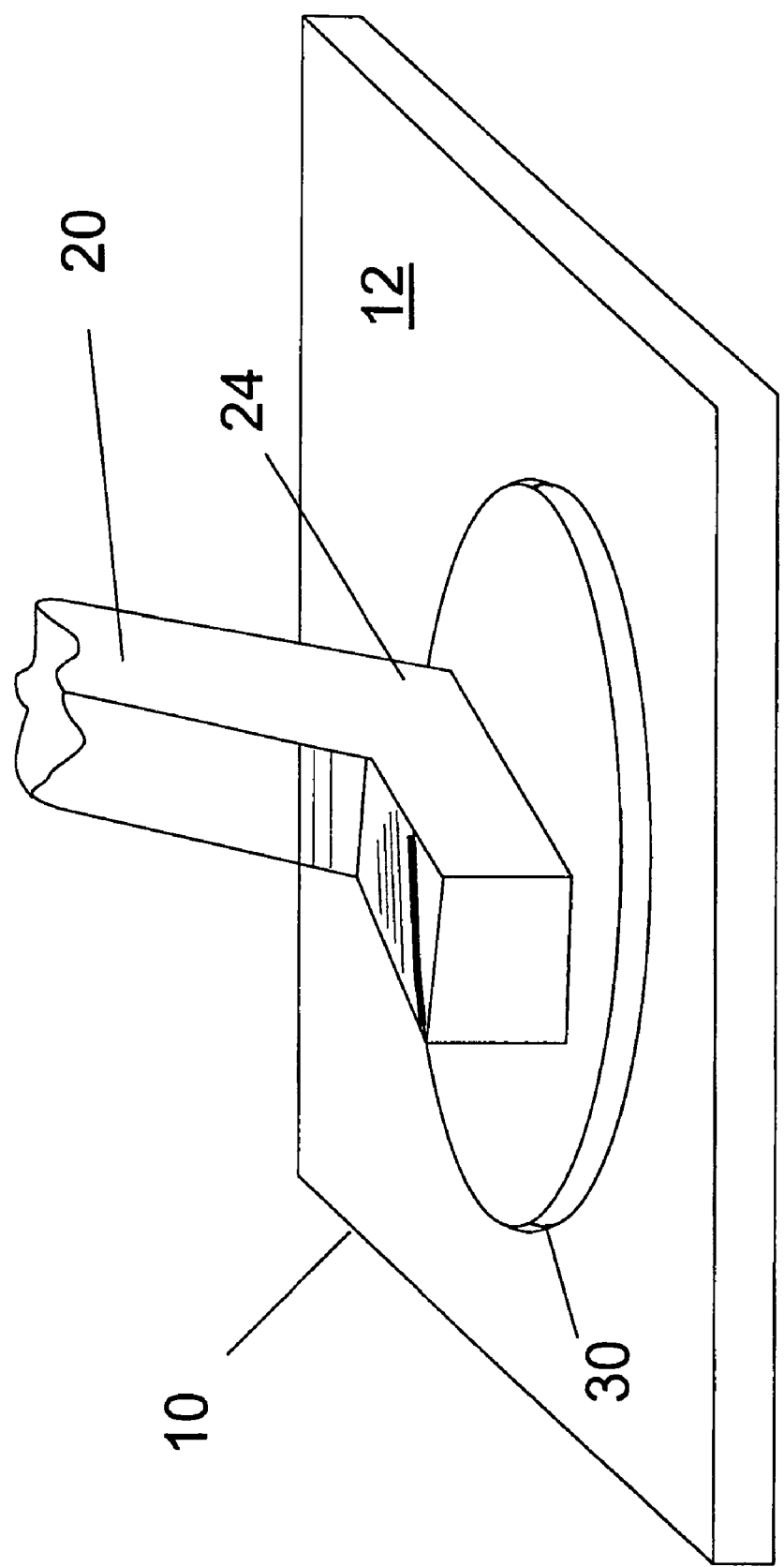
FIG. 2 is a further enlarged view of a base portion of one of the probes of FIG. 1.

Referring to the drawings, wherein like reference numerals are used to represent like components throughout the views, preferred embodiments of the invention as they are currently envisioned are depicted. FIGS. 1 and 2 illustrate a substrate 10 with a mounting surface 12. Mounted to the substrate 10 via a plurality of bonding pads 30 are a plurality of probes 20. The substrate 10 and plurality of probes 20 may be incorporated into a probe card (not fully illustrated) used in wafer testing of integrated circuits. In the art of wafer testing, an exemplary substrate 10 may also be a "space transformer".

The exemplary probes 20 illustrated have an elongated and L-shaped body 22, terminating at a first end in a probe base 24, and at a second end in a probe tip 26. The probes 20 are preferably fabricated from an electrically conductive metal, such as aluminum or copper. When used in wafer testing as part of a probe card, and as discussed above, the probe tips 26 contact connection terminals on an integrated circuit wafer undergoing the test procedure. It is desirable that the probe tips 26 be positioned very precisely relative to one another to ensure proper operation of the probe card during the wafer testing procedure.

The substrate 10 may comprise, for example, a multi-layer ceramic material or a multi-layer organic material. With reference to FIGS. 3A-B and 4A-B, it has been determined that the substrate 10 may be subject to waviness or non-planarity that results from both the process of manufacturing the substrate 10, as well as subsequent processing of the substrate 10. If the probes 20 are mounted to a non-planar mounting surface 12, that waviness or non-planarity in the mounting surface 12 tends to decrease the precision with which the probe tips 26 are positioned relative to the other probe tips 26. The magnitude of the non-planarity tends to be a function of a variety of factors, including, for example, the overall size of the substrate, the number of layers in the substrate 10, materials used in fabrication of the substrate 10, and manufacturing processing.

Figure 3A:
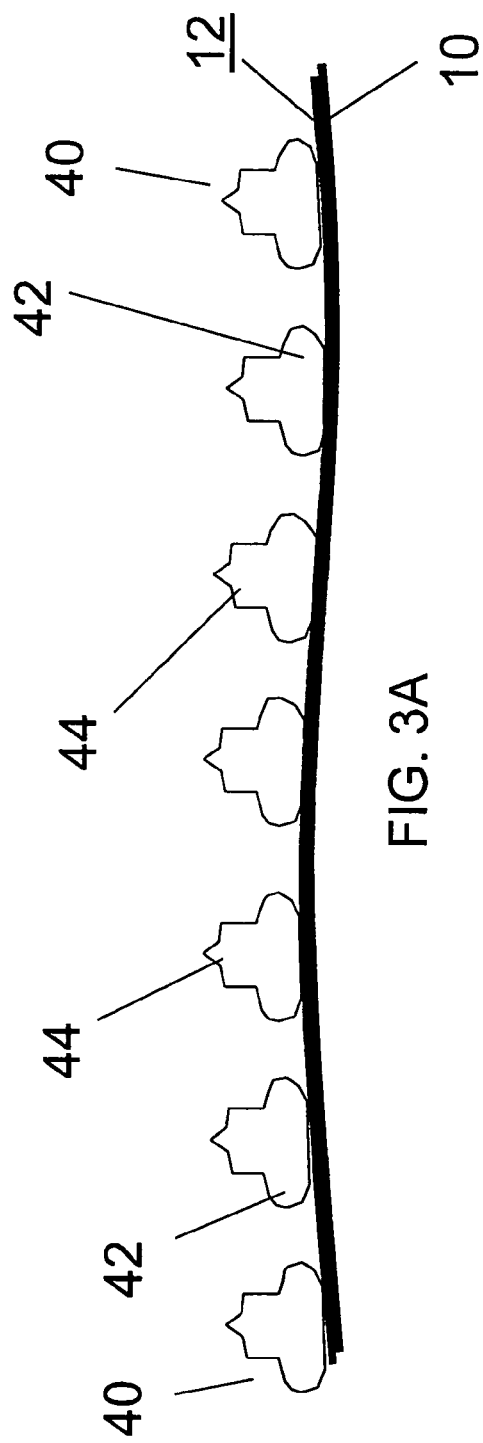
FIG. 3A is a schematic side view of a substrate portion of a probe card used in wafer testing of integrated circuits, illustrating a plurality of bumps applied to a mounting surface of the substrate in accordance with an exemplary embodiment of the present invention.
Figure 3B:
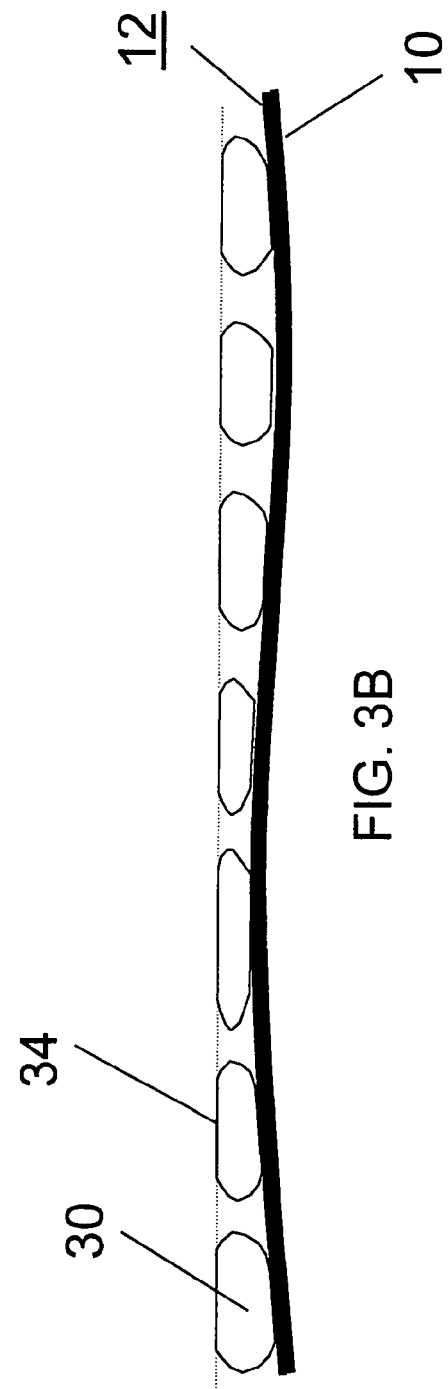
FIG. 3B is a schematic side view of the substrate portion of the probe card of FIG. 3A, illustrating the plurality of bumps flattened into substantially co-planar bonding pads in accordance with an exemplary embodiment of the present invention.
Figure 5:
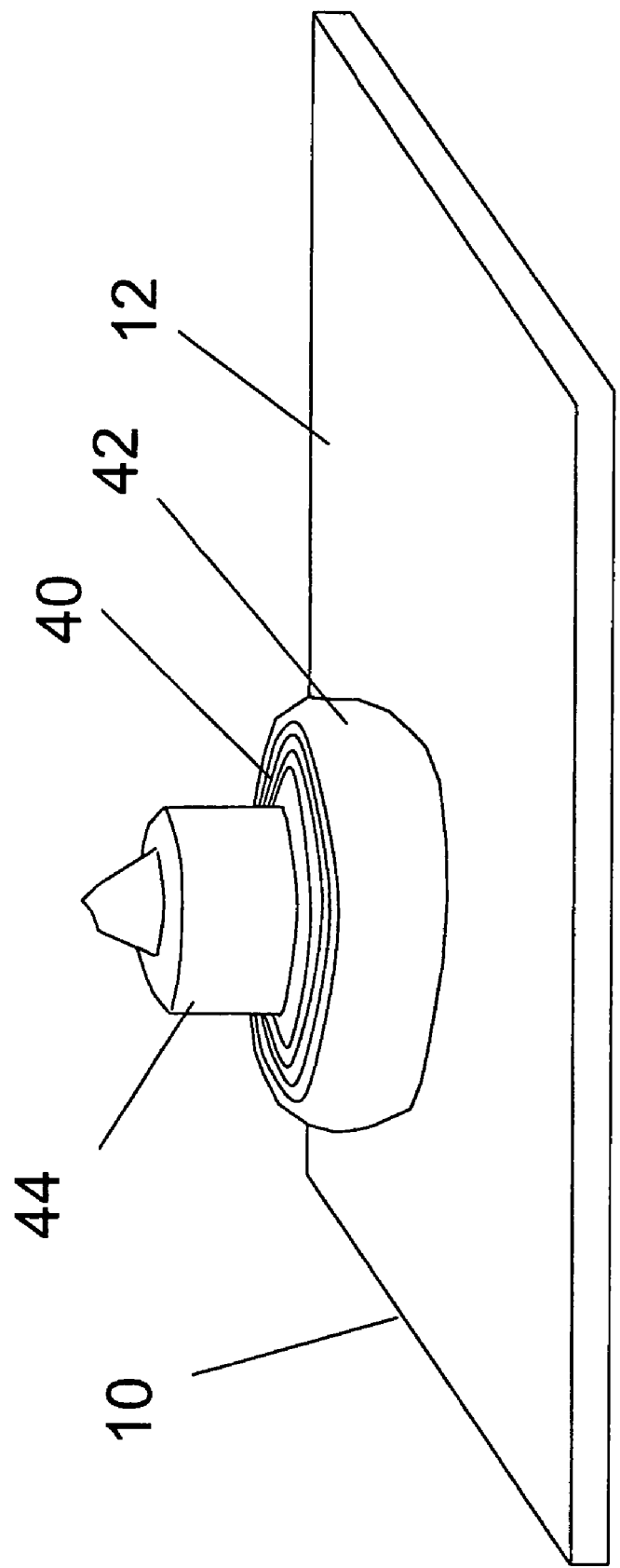
FIG. 5 is a highly enlarged perspective view of a bump applied to a mounting surface of a substrate portion of a probe card used in wafer testing of integrated circuits in accordance with an exemplary embodiment of the present invention.

To overcome problems associated with waviness present in the substrate 10, the present invention forms a plurality of co-planar bonding pads 30 on the mounting surface 12. In particular, with reference to FIGS. 3A and 5, a plurality of bumps 40 are applied to the mounting surface 12. The bumps 40 are formed from an electrically conductive material, and comprise a base portion 42 disposed on the mounting surface 12 and an upper portion 44. In the FIGS. 3A and 3B illustrations, the non-planarity of the substrate 12 is explicitly demonstrated which in this case, has the conductive paths located within the confines of the substrate dimensions. While the figure schematically depicts the bumps 40 as all being substantially similar in shape (e.g., a shape of an aperture of a bonding tool such as a capillary) and substantially similar in size, as will become apparent, the shape and size of the bumps can vary as desired to produce the planar mounting pads.

More particularly, the bump 40 is formed on the mounting surface 12 by a bonding tool. The base 42 is flattened over a generally circular area, and forms the attachment of the bump 40 to the mounting surface 12. The upper portion 44 extends upwardly from the mounting surface 12, and has a shape complimentary to a discharge opening 54 of a bumping tool 50, discussed in more detail below. Exemplary electrically conductive materials used to form the bumps include gold, copper, platinum, palladium, silver, or alloys or combinations thereof. Since the operational purpose of the probe card is to electrically access the semiconductor, the bumps applied to the bond pads of the substrate preferably do not substantially contribute to the series electrical resistance, hence it is an advantage to use a material for the bump which has a high conductivity, and that the high conductivity is maintained after cold-working, since the bump will likely become flattened in attaining substrate co-planarity. Furthermore, the bump material's properties of thermal expansion, thermoelectric junction voltages and fatigue strength preferably do not impact the overall electrical, thermal and mechanical properties of the probe card assembly. A material with good malleability characteristics is desirable. Additional materials such as palladium cobalt may also be used depending on the desired application.

Figure 6:
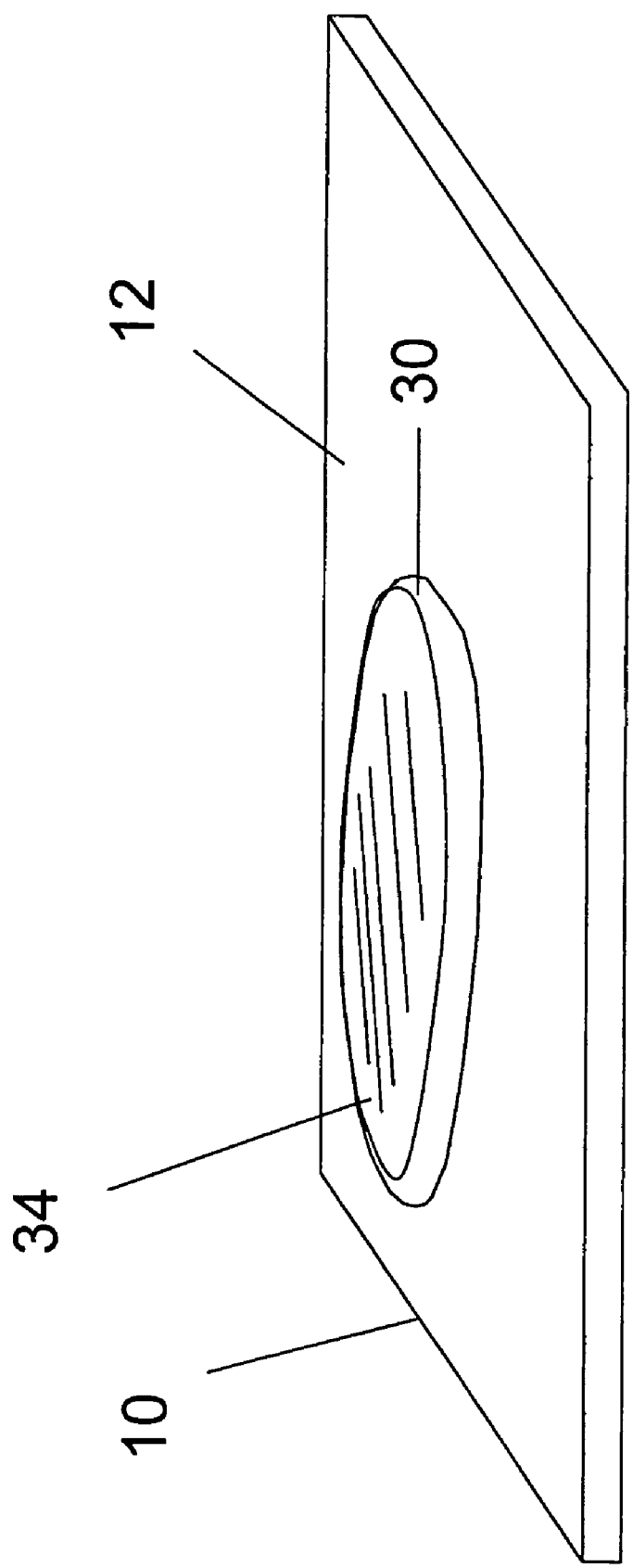
FIG. 6 is a highly enlarged perspective view of the bump of FIG. 5, shown flattened into a bonding pad in accordance with an exemplary embodiment of the present invention.

With reference now to FIGS. 3B and 6, after the bumps 40 are applied to the mounting surface 12, the upper portions 44 are subsequently deformed to form the bonding pads 30. The deformation is designed to flatten the bonding pads to form a substantially planar probe mounting surface 34 for subsequent mounting of foot of a probe. In order for the probe mounting surfaces 34 to be substantially co-planar, the height above the mounting surface 12 to which the upper portion is deformed may be controlled. As such, the deformation of the bumps may vary from no deformation at all to substantial deformation. In FIGS. 4A and 4B, the additional contribution of non-planarity of the raised bond pads 16, to that of the substrate 12 is explicitly demonstrated, such that given the waviness or non-planarity of the substrate, as illustrated in FIGS. 3A and 3B, additional height deviations may come from the raised pads 16, and as a result of the invention the non-planarity due to both of these sources can be substantially compensated.

In certain exemplary embodiments of the present invention, if a relatively hard conductive bump (e.g., a hard gold bump) is to be deposited onto a relatively hard conductive region (e.g., a hard gold conductive region) on or adjacent a surface of the substrate, it may be difficult to form a reliable bond therebetween. In such embodiments, an additive (e.g., a soft gold material) may be deposited on the hard conductive region prior to deposition of the conductive bumps, thereby providing for a more reliable bond.

FIG. 4A is similar to FIG. 3A in that it illustrates a substrate 15 supporting a plurality of bumps 40, where each of the bumps 40 includes a base portion 42 and an upper portion 44; however, in contrast to the exemplary embodiment of the present invention illustrated in FIG. 3A, in FIG. 4A the bumps are deposited on conductive regions 16 (e.g., contact pads, conductive terminals, circuit traces) that are dimensionally above the surface of substrate 15. Because the conductive regions are not planar with respect to one another, the bumps 40 are flattened to form the substantially co-planar bonding pads 30 illustrated in FIG. 4B.

The present invention also contemplates an apparatus for producing the plurality of co-planar bonding pads on a substrate. The apparatus (not fully illustrated) comprises a fixture (not illustrated) for precisely positioning the substrate 10 relative to a remainder of the apparatus. The apparatus further comprises a dispensing mechanism (e.g., a bumping mechanism) for dispensing multiple and separate predetermined quantities of an electrically conductive material (that is, bumps 40) onto the mounting surface 12. With reference to FIG. 7, an exemplary bumping mechanism includes the bumping tool 50 (e.g., a capillary tool 50), having an interior flow path 52 and a discharge orifice 54, through which the electrically conductive material is applied to the mounting surface 12. With reference to FIG. 8, the apparatus further comprises a flattening tool 60 having a planar head 62 for flattening the bumps 40 into the bonding pads 30. The bumping tool 50 and flattening tool 60 may be provided as separate components, or alternatively, may be combined into a single combined tool 70, as illustrated in FIG. 9.

In a third aspect, the invention is a substrate for use with a probe card used in wafer testing of integrated circuits, the substrate comprising a plurality of substantially co-planar bonding pads.

An exemplary method and apparatus for producing a substrate 10 comprising a plurality of substantially co-planar bonding pads may thus be summarized as follows. The substrate 10 is mounted on or within the fixture (not illustrated), to define a reference plane relative to the mounting surface 12 of the substrate 10. The substrate 10 is moved within an operational envelope of the bumping tool 50. The bumping tool 50 is moved over various predetermined positions on the substrate 10 to lay down a pattern of bumps 40. Preferably, the bumps 40 are applied individually, however the bumping tool 50 could be modified to simultaneously apply multiple bumps 40. As described above, the bumps 40 are preferably formed from a malleable material. The bumps 40 are adhered to the substrate 10 using, for example, bonding techniques (e.g., ultrasonic bonding, thermosonic bonding, etc.) known to persons of ordinary skill in the art of semiconductor manufacturing. The substrate 10 may be heated during the bonding process. If copper is used to form the bumps 40, the bumping application process occurs preferably under a non-oxidizing atmosphere.

For most probe card applications, the bumps 40 are extremely diminutive, for example being on the order of 100 μm (approximately 0.004") in diameter and having a comparable height.

After the bump 40 has been applied to the mounting surface 12, the flattening tool 60 is used to individually flatten each bump 40 into a bonding pad 30. Alternatively, the flattening tool 60 could be modified to flatten multiple bumps 40 simultaneously. Movement of the flattening tool 60 is precisely controlled relative to the reference plane such that during the flattening process, the planar head 62 of the flattening tool 60 moves to a precise height relative to the reference plane, with the planar head precisely oriented relative to the reference plane. Thus, the bump 40 is flattened into the bonding pad 30. The bonding pad 30 has a nominal height determined by position of the planar head 62 relative to the reference plane during the flattening process. The flattening tool 60 preferably moves generally perpendicularly to the mounting surface 12. The bonding pad 30 thus formed is generally circular and has a diameter, for example, on the order of approximately 120 μm and a height on the order of 10 μm.

Those skilled in the art will recognize that the actual height of the bonding pad will be increased or reduced relative to the nominal height based upon the local non-planarity of the substrate at a given bonding pad 30 location. According to an exemplary embodiment of the present invention, the nominal height may be selected based upon known statistical distributions of non-planarity of the mounting surface 12. In certain exemplary embodiments of the present invention, it has been found that the ability to obtain co-planar probe mounting surfaces 34 is largely independent of speed of operation of the flattening tool 60.

Figure 10:
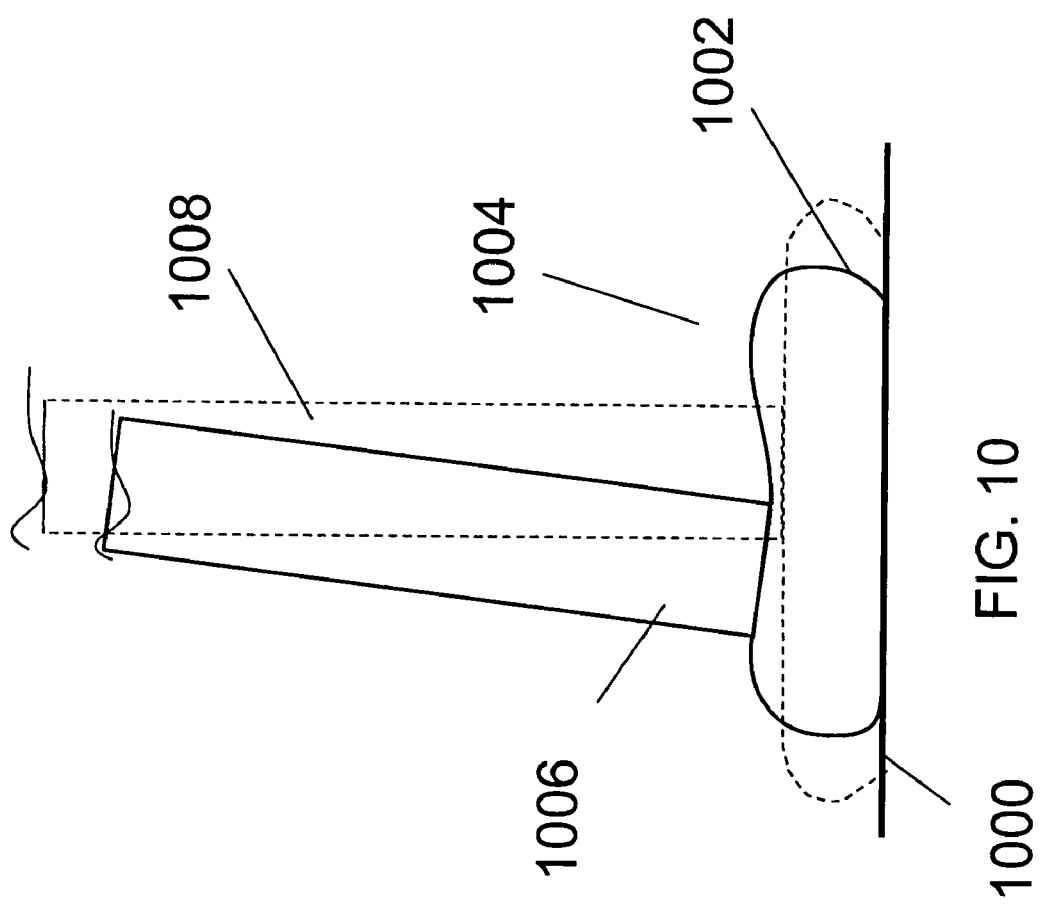
FIG. 10 is a diagram illustrating positioning of a probe coupled to a non-planar bonding pad and positioning of a probe coupled to a planarized bonding pad.

FIG. 10 is a diagram illustrating positioning of a probe of a probe card (e.g., positioning of a probe in at least one of the X-Y planes). More specifically, FIG. 10 illustrates in solid lines, a probe 1006 coupled to a bonding pad 1002 on a surface 1000 of a substrate. As is seen in FIG. 10, the probe 1006 is "tilted" because it has been coupled to a bonding pad that has not been planarized with respect to other bonding pads (not illustrated) on the substrate. Also shown in FIG. 10 (in dashed lines) is a view of a probe 1008 coupled to a bonding pad 1004 that has been planarized according to the present invention. As is shown in FIG. 10, the lower portion of probe 1008 is substantially orthogonal to surface 1000 of the substrate, thus providing for improved repeatability and predictability regarding probe positioning on surface 1000.

The present invention thus provides a substrate or space transformer having bonding pads with improved dimensional control, resulting in probe tips positioned with improved accuracy and precision. It is understood by those skilled in the art that the spring force applied to the probes during the action of applying and sensing voltages on the semiconductor device may be applied in order to compel the probe tip to scrub the metal of the device bond pad so that a low resistance electrical connection is temporarily made. The distribution range of the forces applied extend from those probe tips which are furthest from the device pad surface, to those probe tips which are in closest proximity is relevant considering the overtravel which must be applied to implement the scrub to a sufficient extent for the entire distribution of the probe tip heights. By maintaining the initial level of the substrate and its bond pads to a high degree of planarity, it is expected that the uniform shape and precision placement of the probes will also result in a nearly planar array of probe tips. This assists with a number of desirable qualities of the probe card, for example, the overtravel can be reduced since the range of probe tips heights is smaller, the distribution of forces is narrower since the range of deflections is also narrower, the peak stress within the probe is expected to be smaller in accordance with the narrower force distribution, and the overall fatigue life would be expected to be longer, following the lower peak stress.

The scope of the present invention is not limited to the illustrated configurations. For example, the conductive material (e.g., bumps) are not necessarily deposited via a bonding tool. Alternative configurations (e.g., solder ball deposition, screen printing, etc.) are contemplated. Likewise, the bonding pads need not be planarized by a flattening tool such as is illustrated. For example, the bumps may be planarized in a gang configuration (e.g., in groups, rows, etc) using any of a number of flattening/planarizing mechanisms.

Further still, the substrate of the present invention is not limited to any particular design or configuration. For example, the substrate may be a space transformer. The substrate may be a multi-layer ceramic substrate, a multi-layer organic substrate, or a single layer substrate.

According to certain exemplary embodiments of the present invention, either or both sides of the substrate may be provided with substantially planar bonding pads. In probe card substrates (e.g., space transformers), the opposite side of the substrate (not the side configured to contact the probes) may be provided with planarized contact pads as described herein for planar contact with, for example, an interposer (e.g., including spring contact pins or the like) of the probe card/probe card assembly).

The present invention may be embodied in other specific forms without departing from the spirit or essential attributes thereof. Although the invention has been described and illustrated with respect to the exemplary embodiment thereof, it should be understood by those skilled in the art that the foregoing and various other changes, omissions and additions may be made therein and thereto, without parting from the spirit and scope of the present invention.

What is claimed is:

1. A method of processing a substrate, the method comprising the steps of:
    applying a plurality of bumps of electrically conductive material onto conductive regions of the substrate;
        wherein prior to applying the plurality of bumps, the substrate is substantially non-planar; and
    deforming two or more bumps of the plurality of bumps such that an entire top surface of each of the two or more bumps is both substantially flat and substantially co-planar with one another, the deforming step comprising:
        applying a flattening tool to a first bump of the two or more bumps such that a planar head of the flattening tool that is in contact with the entire top surface of the first bump is substantially at a specified distance relative to a reference plane; and
        applying the flattening tool to a second bump of the two or more bumps such that the planar head of the flattening tool that is in contact with the entire top surface of the second bump is substantially at the specified distance relative to the reference plane.

2. The method of claim 1 further comprising the step of depositing an additive material on the conductive regions prior to the applying step.

3. The method of claim 2 wherein the additive material is a relatively soft gold material.

4. The method of claim 1 wherein:
    the applying step includes applying the plurality of bumps using a bonding tool; and
    the flattening tool is integrated with the bonding tool.

5. The method of claim 1 further comprising the step of heating at least one of the substrate or the plurality of bumps prior to the deforming step.

6. The method of claim 1 wherein the step of applying includes screen printing the plurality of bumps onto the conductive regions of the substrate.

7. The method of claim 1 wherein the deforming step includes deforming the two or more bumps substantially simultaneously.

8. The method of claim 1, wherein prior to deforming the two or more bumps, an original top surface of each of the two or more bumps is not substantially co-planar with one another.

9. The method of claim 1, wherein the specified distance is determined based upon statistical distributions of non-planarity for a set of substrates.

10. A method of processing a substrate for use in wafer testing of integrated circuits, the method comprising the steps of:
    applying a plurality of bumps of electrically conductive material onto conductive regions of a substrate;
        wherein prior to applying the plurality of bumps, the substrate is substantially non-planar;
    deforming two or more of the plurality of bumps such that an entire top surface of each of the two or more bumps is both substantially flat and substantially co-planar with one another, the deforming step comprising:
        applying a flattening tool to a first bump of the two or more bumps such that a planar head of the flattening tool that is in contact with the entire top surface of the first bump is substantially at a specified distance relative to a reference plane; and applying the flattening tool to a second bump of the two or more bumps such that the planar head of the flattening tool that is in contact with the entire top surface of the second bump is substantially at the specified distance relative to the reference plane; and mounting a probe element to the substantially flat entire top surface of each of the two or more bumps.

11. The method of claim 10 further comprising the step of depositing an additive material on the conductive regions prior to the applying step.

12. The method of claim 11 wherein the additive material is a relatively soft gold material.

13. The method of claim 10 wherein:

the applying step includes applying the plurality of bumps using a bonding tool; and the flattening tool is integrated with the bonding tool.

14. The method of claim 10 further comprising the step of heating at least one of the substrate or the plurality of bumps prior to the deforming step.

15. The method of claim 10 wherein the step of applying includes screen printing the plurality of bumps onto the conductive regions of the substrate.

16. The method of claim 10 wherein the deforming step includes deforming the two or more bumps substantially simultaneously.

17. The method of claim 10, wherein prior to deforming the two or more bumps, an original top surface of each of the two or more bumps is not substantially co-planar with one another.

18. The method of claim 10, wherein the specified distance is determined based upon statistical distributions of non-planarity for a set of substrates.

* * * * *